Feb. 2, 1965 H. UR 3,168,653
TUNNEL DIODE CIRUIT WITH REDUCED RECOVERY TIME
Filed March 21, 1961
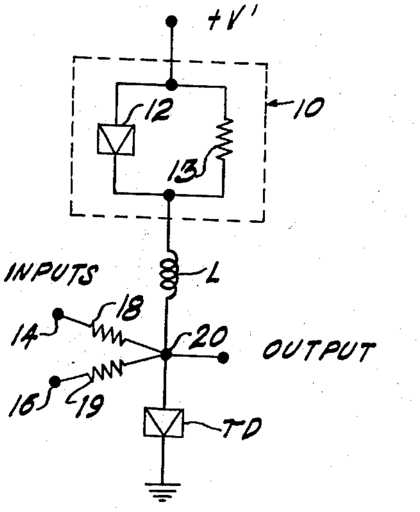
FIG. 1.
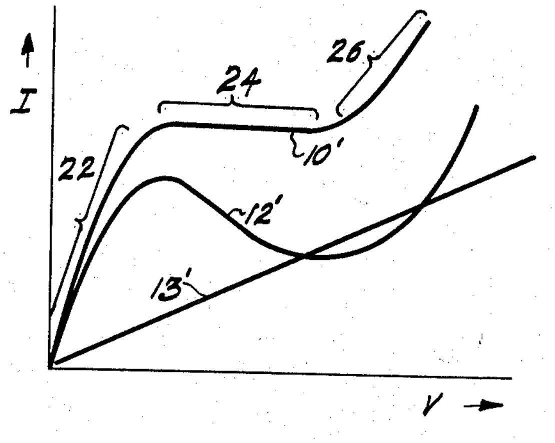
FIG. 2.
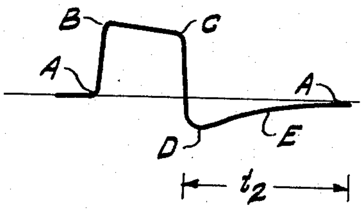
FIG. 5.
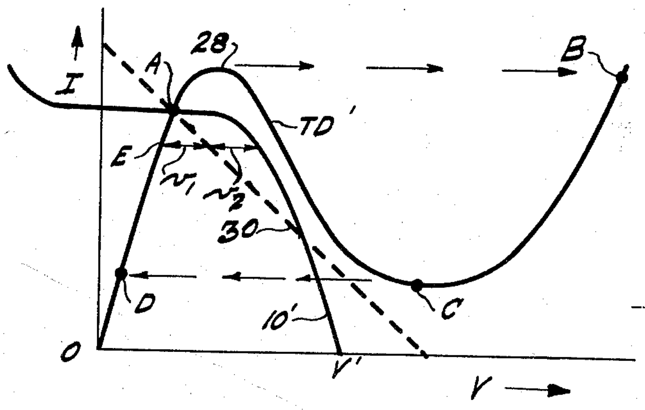
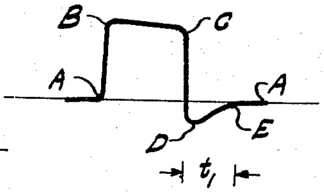
FIG. 4.
FIG. 3.
INVENTOR.
HANOCH UR
BY Carl V. Olson
ATTORNEY 3,168,653
Patented Feb. 2, 1965

3,168,653

TUNNEL DIODE CIRCUIT WITH REDUCED RECOVERY TIME

Hanoch Ur, Camden, N.J., assignor to Radio Corporation of America, a corporation of Delaware Filed Mar. 21, 1961, Ser. No. 97,204
11 Claims. (Cl. 307—88.5)

This invention relates to tunnel diode circuits, and more particularly to high-speed tunnel diode pulse circuits.

It is an object of this invention to provide an improved tunnel diode circuit including means for reducing the time required for recovery of the circuit after it has been switched, whereby the circuit is capable of a higher operating pulse repetition rate.

It is another object of this invention to provide an improved tunnel diode circuit characterized in being relatively uneffected by changes in power supply voltage.

It is a further object of this invention to provide an improved tunnel diode circuit capable of being biased from a voltage source so that the power loss and heat dissipation problems associated with current sources are avoided.

It is still another object to provide an improved tunnel diode circuit which is simple and economical in requiring only one bias supply.

It is yet a further object to provide an improved tunnel diode circuit which is easily switched in response to an input signal level, rather than solely in response to the leading edge of an input pulse.

In one aspect, the invention comprises a tunnel diode monostable circuit including a nonlinear impedance means, an inductor and a tunnel diode connected in series between the terminals of a voltage source. Signal input and output means are coupled to the tunnel diode. The nonlinear impedance means may be constituted by another tunnel diode and a parallel resistor.

The resistor is chosen to have a value such that the composite characteristic of the other tunnel diode and the resistor includes a low-voltage low-impedance low-current region, an intermediate-voltage high-impedance substantial-current region and a high-voltage low-impedance high-current region. The values of the various circuit elements are selected so as to provide a quiescently biased circuit operating point at an intersection of the low-voltage positive-resistance region of the characteristic of the tunnel diode and the high-impedance substantially constant-current region of the characteristic of the non-linear impedance means. Alternatively, the non-linear impedance means may be constituted by a form of semiconductor device having an effective inherent internal parallel resistance to provide the desired composite non-linear impedance characteristic.

These and other objects and aspects of the invention will be apparent to those skilled in the art from the following more detailed description taken in conjunction with the appended drawings, wherein:

FIGURE 1 is a circuit diagram of a monostable tunnel diode circuit constructed according to the teachings of this invention;

FIGURE 2 is a current-voltage chart which will be referred to in describing the non-linear impedance means included in the circuit of FIGURE 1;

FIGURE 3 is a current-voltage chart which will be referred to in describing the construction and operation of the circuit of FIGURE 1;

FIGURE 4 illustrates an output voltage waveform obtained from a monostable circuit constructed according to the teachings of this invention; and FIGURE 5 illustrates an output voltage waveform obtained from prior art circuits and illustrating, by comparison with FIGURE 4, the longer recovery time involved.

FIGURE 1 shows a monostable tunnel diode circuit including a nonlinear impedance means 10, an inductor L and a tunnel diode TD all connected in series between the +V' and ground terminals of a voltage source. The nonlinear impedance means is illustrated as being constituted by another tunnel diode 12 in parallel with a resistor 13. Signal input terminals 14 and 16 are coupled through resistors 18 and 19, respectively, to the junction point 20 between the inductor L and the tunnel diode TD. A signal output is obtained from the junction point 20.

FIGURE 2 shows the current-voltage characteristic 10' of the nonlinear impedance means 10 in the circuit of FIGURE 1. The characteristic 10' is a composite characteristic obtained by adding the characteristic 12' of the tunnel diode 12 to the characteristic 13' of the parallel resistor 13. Since the other tunnel diode 12 and resistor 13 are connected in parallel, the current through the nonlinear impedance means 10 is the sum of the currents through the two parallel paths at each value of voltage across the nonlinear impedance means. The other tunnel diode 12 and the resistor 13 are selected to provide a composite characteristic 10' having a low-voltage low-impedance low-current region 22, an intermediate-voltage high-impedance substantially constant-current region 24 and a high-voltage low-impedance high-current region 26. The value of the resistance provided by the resistor 13 is represented in FIGURE 2 by the slope of the line 13'. The elements are also selected so that the constant current region 24 has a constant current value less than the peak current (28 in FIGURE 3) of the tunnel diode TD.

FIGURE 3 is a current-voltage chart showing the characteristic TD' of the tunnel diode TD in the circuit of FIGURE 1. The characteristic TD' includes a low-voltage positive-resistance region extending from the origin O to the current peak 28, a negative resistance region extending from the peak point 28 to the valley point C, and a high-voltage positive-resistance region extending from the valley point C to the point B and beyond. FIGURE 3 also shows the characteristic 10' of the nonlinear impedance means 10. The characteristic 10' is the same as the characteristic 10' in the chart of FIGURE 2, but is oriented in the chart of FIGURE 3 in such a way as to illustrate the fact that it acts as a load on the tunnel diode TD.

As is illustrated in FIGURE 3, the circuit elements of FIGURE 1 are selected so that a quiescently biased operating point A is provided at an intersection of the low-voltage positive-resistance region of the characteristic TD' of the tunnel diode TD and the high-impedance substantially contant-current region of the characteristic 10' of the nonlinear impedance means 10. Since the two characteristic curves shown have no other intersection, the circuit has only one stable operating point and is, therefore, monostable.

The operation of the circuit of FIGURE 1 will now be described with reference to the chart of FIGURE 3. An input signal applied to one or both of the input terminals 14 and 16 supplies additional current to the tunnel diode TD and causes the operating point to rise from the quiescent operating point A, go over the peak 28 and rapidly switch to a point such as point B in the high-voltage positive-resistance region of the tunnel diode characterisitc. Then the operating point moves down along the characteristic TD' to the point C, switches rapidly to a point such as point D and then returns to the quiescently biased operating point A. FIGURE 4 shows the output signal voltage waveform, and shows points A, B, C and D thereon corresponding with the similarly designated operating point in the chart of FIGURE 3.

The time required for the operating point to return from the point D to the quiescently biased point A is the recovery time of the circuit. It is desired that the recovery time be as short as possible, because the recovery time limits the repetition rate of the circuit. The circuit of FIGURE 1 differs from prior art circuits in incorporating a nonlinear impedance means 10, which provides a load characteristic 10′, in place of the usual linear impedance providing the load characteristic illustrated by the dashed line 30. The use of the nonlinear impedance means 10 in the circuit of FIGURE 1 results in an output waveform having a shortened recovery time $t_1$ illustrated in FIGURE 4, as compared with the longer recovery time $t_2$ in FIGURE 5 resulting from the use of a linear impedance.

The duration of the recovery time corresponds with the time it takes for the operating point to move, in FIGURE 3, from the point D to the point A. The speed with which the operating point moves from the point D to the point A depends on the voltage across the inductor L, which is the voltage difference between the operating point on the characteristic TD′ and the voltage at the same current level on the load characteristic 10′ or 30, as the case may be. It is seen that when the operating point on the characteristic TD′ is at the point E, a voltage $v_1$ is operative to restore the output voltage to its initial quiescent value when a linear impedance 30 is employed. On the other hand, a voltage $v_1$ plus a voltage $v_2$ is effective when a nonlinear impedance 10 according to the invention is employed. This explains in a qualitative way the marked improvement or reduction in the recovery time obtained by following the teachings of this invention.

Another advantage of the circuit of the invention is that the quiescent operating point A is relatively stable and unaffected by undesired changes in the power supply voltage +V′. Changes in the voltage V′ cause a lateral shifting of the characteristic 10′ in the chart of FIGURE 3, but this shift does not result in a change in the current value or threshold value of the quiescent operating point A because the constant current region of the characteristic 10′ continues to intersect the characteristic TD′ at the same point A. By comparison, it is clear that a lateral shifting of the linear characteristic 30 causes a large change in the position of the quiescent operating point A.

A further advantage of the circuit of FIGURE 1 is that it switches in response to changes in input signal level, and is not limited to switching in response to the leading edge of an input signal pulse. Therefore, the circuit can be arranged to switch in response to coincidence between an input voltage level on one of the inputs and the leading edge of a voltage pulse on the other input. This desirable characteristic is important in computer logic applications. Without this characteristic, prior art circuits have required the substantial coincidence of the leading edges of two input pulses—a condition difficult to realize in practice in a complex system.

The circuit switches in response to an input signal level which exceeds the threshold for which the circuit is designed because of the constant-current characteristic presented by the nonlinear impedance means 10. Practically all of the input signal current is directed to the tunnel diode TD to cause switching, and substantially none of the input signal current is diverted through the inductor L and the impedance means 10. By contrast, in a circuit not having the impedance means 10, only the leading edge of an input pulse is directed to the tunnel diode TD, and thereafter input signal current in an increasing amount is diverted through the inductor L.

An additional advantage of the circuit of FIGURE 1 is that it employs a voltage source rather than a current source. A current source, often required by prior art circuits, consists of a relatively large voltage source in series with a relatively large resistor. This provides a substantially constant-current to the circuit, but has the disadvantage of requiring the dissipation of a relatively large amount of power in the source resistor. This power appears as heat which is difficult to remove, particularly in high speed systems wherein the elements are arranged close together in a small volume. The voltage source required by the circuit of FIGURE 1 involves no such power loss or heat dissipation problem.

While the nonlinear impedance means 10 has been shown as being constituted by a tunnel diode in parallel with a resistor, it will be understood that other nonlinear impedance means providing a similar current-voltage characteristic may be employed. The impedance means employed may be a tunnel diode having an effective internal parallel resistance. Or, the means may be constituted by a type of semiconductor device similar to a tunnel diode but having an intermediate substantially constant current region at a substantial current level, rather than a negative-resistance region. The characteristic provided may be one like the characteristic 10′ of FIGURE 2 but differing therefrom in the high voltage region 26. This is so because the region 26 of the characteristic is not utilized in the operation of the invention.

A conventional tunnel rectifier does not provide the desired characteristic because its characteristic has an intermediate high-impedance substantially constant-current region at a zero current level. Therefore, it cannot be substituted for the nonlinear impedance means 10 to provide a characteristic, such as characteristic 10′ in FIGURE 3, having a constant-current region intersecting the tunnel diode characteristic TD′ at point A near the current peak 28. While it may be possible to provide the characteristic 10′ by means of a tunnel rectifier and a separate additional bias source, a circuit according to the present invention is simple and economical in requiring only one bias source.

What is claimed is:

1. A tunnel diode circuit comprising circuit elements including nonlinear impedance means exhibiting a current-voltage characteristic including a low voltage-low-impedance low-current region followed by an intermediate-voltage high-impedance substantially constant-current region, a tunnel diode, means coupling said nonlinear impedance means and said tunnel diode in series across a voltage source, signal input and output circuits connected to said tunnel diode, the values of said circuit elements being chosen to provide a quiescently biased operating point at an intersection of the low-voltage positive-resistance region of the characteristic of said tunnel diode and the high-impedance substantially constant-current region of the characteristic of said nonlinear impedance means.

2. A tunnel diode circuit as defined in claim 1 wherein said nonlinear impedance means is another tunnel diode and a resistor in parallel.

3. A tunnel diode circuit as defined in claim 1 wherein said nonlinear impedance means is constituted by a semiconductor device having an effective inherent internal parallel resistance.

4. A tunnel diode circuit comprising circuit elements including nonlinear impedance means exhibiting a current-voltage characteristic including a low-voltage low-impedance low-current region followed by an intermediate-voltage high-impedance substantially constant-current region, a tunnel diode connected in series with said means, and a voltage source connected across the series combination of said nonlinear impedance means and said tunnel diode, signal input and output circuits connected to said tunnel diode, the values of said circuit elements being chosen to provide a quiescently biased operating point at an intersection of the low-voltage positive-resistance region of the characteristic of said tunnel diode and the high-impedance substantially constant-current region of the characteristic of said nonlinear impedance means.

5. A tunnel diode circuit comprising circuit elements including nonlinear impedance means exhibiting a current-voltage characteristic including a low-voltage low-impedance low-current region, followed by an intermediate-voltage high-impedance substantially constant-current region, an inductor, a tunnel diode, means connecting said nonlinear impedance means, said inductor and said tunnel diode in series across a voltage source, signal input and output circuits connected to said tunnel diode, the values of said circuit elements being chosen to provide a quiescently biased operating point at an intersection of the low-voltage positive-resistance region of the characteristic of said tunnel diode and the high-impedance substantially constant-current region of the characteristic of said nonlinear impedance means.

6. In combination, circuit elements including nonlinear impedance means exhibiting a current-voltage characteristic including a low-voltage low-impedance low-current region followed by an intermediate-voltage high-impedance substantially constant-current region, a tunnel diode, means coupling said nonlinear impedance means and said tunnel diode in series across a voltage source, and signal input and output circuits connected to said tunnel diode, the values of said circuit elements being chosen to provide a quiescently biased operating point at an intersection of the positive-resistance region of the characteristic of said tunnel diode and the high-impedance substantially constant-current region of the characteristic of said nonlinear impedance means.

7. In combination, circuit elements including nonlinear impedance means exhibiting a current-voltage characteristic including a low-voltage low-impedance low-current region followed by an intermediate-voltage high impedance substantially constant-current region, a negative resistance diode, means coupling said nonlinear impedance means and said negative resistance diode in series across a voltage source, and signal input and output circuits connected to said negative resistance diode, the values of said circuit elements being chosen to provide a quiescently biased operating point at an intersection of the positive-resistance region of the characteristic of said negative resistance diode and the high-impedance substantially constant-current region of the characteristic of said nonlinear impedance means.

8. The combination comprising circuit elements including nonlinear impedance means exhibiting a current-voltage characteristic including a low-voltage low-impedance low-current region followed by an intermediate-voltage high impedance substantially constant-current region, a tunnel diode, and means coupling said nonlinear impedance means and said tunnel diode in series across a voltage source, the values of said circuit elements being chosen to provide a quiescently biased operating point at an intersection of the positive-resistance region of the characteristic of said tunnel diode and the substantially constant-current region of the characteristic of said nonlinear impedance means.

9. The combination of a first negative resistance diode having a current-voltage characteristic including a negative resistance region, means providing shunt resistance across said negative resistance diode in an amount which translates said negative resistance region to a high-impedance substantially constant-current region, a second negative resistance diode having a positive resistance region, and means to quiescently bias said negative resistance diodes so that the constant-current region of said first resistance shunted diode intersects the positive resistance region of said second diode.

10. The combination of a first negative resistance diode having a current-voltage characteristic including a negative resistance region, means providing shunt resistance across said negative resistance diode in an amount which translates said negative resistance region to a substantially constant-current region, a second negative resistance diode having a positive resistance region, an inductor in circuit between said diodes, and means to quiescently bias said negative resistance diodes so that the constant-current region of said first resistance-shunted diode intersects the positive resistance region of said second diode.

11. The combination of a first tunnel diode having a current-voltage characteristic including a negative resistance region, means providing shunt resistance across said negative resistance diode in an amount which translates said negative resistance region to a high-impedance substantially constant-current region, a second tunnel diode having a positive resistance region, and means to quiescently bias said negative resistance diodes so that the constant-current region of said first resistance-shunted diode intersects the positive resistance region of said second diode.

References Cited in the file of this patent

G.E. Tunnel Diode Manual, March 20, 1961, 1st ed. (page 59 relied on), TK-7872-S4-G4.

Chow: "Tunnel Diode Logic Circuit," Electronics, June 24, 1960 (page 104 relied on).